United States Patent [19]

Katoda et al.

[11] 4,216,037

[45] Aug. 5, 1980

[54] METHOD FOR MANUFACTURING A HETEROJUNCTION SEMICONDUCTOR DEVICE BY DISAPPEARING INTERMEDIATE LAYER

[75] Inventors: Takashi Katoda, 1-3-4, Suwada, Ichikawa-shi, Chiba-ken, Japan; Masato Kishi, Tokyo, Japan

[73] Assignee: Takashi Katoda, Chiba, Japan

[21] Appl. No.: 1,170

[22] Filed: Jan. 5, 1979

[30] Foreign Application Priority Data

| Jan. 6, 1978 | [JP] | Japan | 53/208 |
| Jan. 6, 1978 | [JP] | Japan | 53/209 |
| Aug. 25, 1978 | [JP] | Japan | 53/103673 |

[51] Int. Cl.² ............................................. H01L 31/18
[52] U.S. Cl. .................................. 148/175; 148/174; 357/61
[58] Field of Search .................. 148/174, 175; 357/61

[56] References Cited

U.S. PATENT DOCUMENTS

| 3,433,684 | 3/1969 | Zanowick et al. | 148/33.4 |
| 3,696,262 | 10/1972 | Antypas | 313/94 |
| 3,699,401 | 10/1972 | Tietjfn et al. | 317/234 R |
| 3,821,033 | 6/1974 | Hu | 148/175 |
| 3,925,119 | 12/1975 | Philbrick et al. | 148/175 |
| 3,932,883 | 1/1976 | Rowland | 357/30 |
| 3,985,590 | 10/1976 | Mason | 148/175 |
| 4,088,515 | 5/1978 | Blakeslee et al. | 148/175 |
| 4,095,331 | 6/1978 | Rutz | 29/589 |
| 4,159,354 | 6/1979 | Milnes et al. | 427/74 |

OTHER PUBLICATIONS

Saul, "... Transition Zone ... GaP ...," Jour. Appl. Phys. 40 (1969), 3273.
Ido et al., "... GeSb-Ge Heterojunctions ...," Jap. Jour. Appl. Phys. 10, (1971), 1388.
Blum et al., "Vapor Growth of GaP onto Si ...," IBM-TDB, 13, (1970), 1245.
Shang, "LED with Si Substrate," IBM-TDB, 13, (1971), 2609.

*Primary Examiner*—L. Dewayne Rutledge
*Assistant Examiner*—Upendra Roy
*Attorney, Agent, or Firm*—Oblon, Fisher, Spivak, McClelland & Maier

[57] ABSTRACT

A method for manufacturing a semiconductor device comprises evaporating phosphorus on a silicon substrate to form a thin phosphorus layer and growing gallium phosphide on the substrate having the thin phosphorus layer, heterojunction being defined between the substrate and the semiconductor layer only in the region where the thin film had been formed prior to the growth of gallium phosphide.

3 Claims, 7 Drawing Figures

METHOD FOR MANUFACTURING A HETEROJUNCTION SEMICONDUCTOR DEVICE BY DISAPPEARING INTERMEDIATE LAYER

BACKGROUND OF THE INVENTION

This invention relates to a method of growing on a substrate a semiconductor layer which is different in its constituent element or elements from the substrate to form a heterojunction therebetween.

Semiconductor techniques have recently made great strides and an extensive study and development have been made on "element" semiconductors such as silicon (Si) and germanium (Ge) and on various "compound" semiconductor such as gallium phosphide (GaP) and gallium arsenide (GaAs). Some are put to practical use. Such marked advance of the semiconductor techniques owes much to a method for preparing a semiconductor material. One of the most important problems in the study and developments of a method for preparation of a semiconductor material is to provide a method for forming on a substrate a semiconductor layer at least partially different in its constituent element or elements from the substrate, i.e. a method for forming a "semiconductor heterojunction" in a broad sense of the word. The "semiconductor heterojunction" herein defined is intended to include (1) a junction between different semiconductors such as a junction between different element semiconductors, a junction between an element semiconductor and a compound semiconductor or a junction between compound semiconductors at least partially different in its constituent element or elements from each other, and (2) a junction between a semiconductor and a material other than the semiconductor, such as a junction between a sapphire substrate and a semiconductor layer on the sapphire substrate. Formation of a good-quality semiconductor heterojunction theoretically possesses the way for an improvement on the characteristics of electronic or optical devices, or for realization of an entirely novel device. At the present time, merely a semiconductor laser device using a GaAs-GaAlAs heterojunction and an SOS structure (a single-crystal silicon layer is formed on a sapphire substrate) come into practical use. The reason for this is that it is generally difficult to form a semiconductor heretojunction, and that a desired semiconductor layer is not grown on a substrate different in its constituent element from the semiconductor layer or, even if a semiconductor layer is formed on such a substrate, it is often of a polycrystalline or amorphous type and not good in its crystallinity as a single crystal. It is generally said that a semiconductor heterojunction is more easily formed when it is formed between the materials which are close in their lattice constant and thermal expansion coefficient to each other. When, for example, gallium arsenide layer is formed on the germanium substrate, a relatively desirable state is obtained, but no expected germanium-gallium arsenide heterojunction has been formed up to this date and it is in a very fundamental stage from the standpoint of crystallinity.

A technique for forming a compound semiconductor on a silicon substrate is most expected to be realized in an attempt to obtain a semiconductor heterojunction. The reason is because light-emitting devices or light receiving devices can be formed on a silicon substrate of which the manufacturing technique is most advanced and which is inexpensive and wide in its application range. Moreover, much can be expected from the standpoint of costs as compared with the case where these devices are all made of a compound semiconductor, and these devices can be interpolated into an integrated circuit which utilizes a widely used silicon substrate. There is also a possibility that a heterojunction emitter transistor will be realized. The heterojunction emitter transistor is of a three-layer structure having, for example, a gallium phosphide layer on a substrate having a pn junction in it, for example, an n-p-n structure (i.e. an n-type gallium phosphide (emitter)-p-type silicon (base)-n-type silicon (collector) structure) and a p-n-p structure (i.e. a p-type gallium phosphide (emitter)-n-type silicon (base)-p-type silicon (collector) structure). For example, when a forward bias is applied between the base and the emitter of such an n-p-n transistor structure, electrons are injected from the emitter to the base of the transistor, but holes are not injected from the base to the emitter of the transistor because the width of forbidden band of the gallium phosphide is greater than that of the silicon. For this reason, the emitter injection efficiency is 100% and an improvement on the characteristics of the transistor is thus expected. The principle of a heterojunction emitter transistor has already been proposed in Proc. IRE, vol. 45,1957. Much has been expected for realization of a heterojunction between silicon and a compound semiconductor, but there has hardly been any report showing that a single crystalline compound semiconductor structure is formed on a single crystal silicon substrate having a relatively wide area of, for example, about 5 mm×5 mm. A report has been made by H. B. Pogge, B. M. Kemlage and R. W. Broadie in the U.S.A. in 1977, showing that a relatively-good-quality gallium phosphide layer is formed in two steps on a silicon substrate (see Journal of Crystal Growth, vol. 37, 1977, pp. 13 to 22). This method comprises growing a gallium phosphide layer on a silicon substrate through thermal decomposition of an organic compound of gallium using the chemical reaction with phosphine ($PH_3$) and then growing a gallium phosphide layer (a second layer) through a $Ga-PCl_3-H_2$ reaction. However, this method has the following disadvantages. Firstly, the method involves complicated steps and, in spite of a supposition that formation of gallium phosphide can be attained using either one of a gallium organic material-$PH_3$-$H_2$ system and $Ga-PCl_3-H_2$ system, it is necessary to use both the systems. This is very disadvantageous from the standpoint of a work process as well as of a device. Secondly, it is necessary to use harmful, high-explosive phosphine ($PH_3$). $PH_3$ is commercially available usually in such a state that it is contained at a lower concentration level in normal $H_2$ gas. Even such a lower concentration of $PH_3$ is very noxious and high-explosive. In spite of this fact, a fairly high concentration of $PH_3$ is required in the step of the above-mentioned method, thus involving high risks during the process. Thirdly, a gallium phosphide layer obtained is poorer in its electrical properties. A gallium phosphide layer to be initially formed by a thermal decomposition method on the silicon substrate is formed not in such a sustantially equilibrium state as when a normally good-quality single crystal is grown, but under the condition that gallium phosphide produced through thermal decomposition is "deposited" onto the silicon substrate (in this case, gallium phosphide is deposited unconditionally onto the silicon substrate). For this reason, a boundary structure between the silicon substrate and the gallium phosphide layer (first layer) is disturbed and is undesirable from the standpoint of, for example, crystallographical and electrical properties. A first undesirable gallium phosphide layer, after a second gallium phosphide layer is deposited thereon, remains deposited as it is and an unnecessary junction can be formed between the first gallium phosphide layer and the second gallium phosphide layer. Though this junction is one between the semiconductors each having the same constituents, if such unnecessary junction is included there, the characteristics of, for example, electronic devices in general suffer disadvantages. Even in this sense, it can not be said that a silicon-gallium phosphide heterojunction is good.

SUMMARY OF THE INVENTION

It is accordingly an object of this invention to provide a method for manufacturing a semiconductor device, which can form a good-quality heterojunction in a simple process without involving any risk.

According to one aspect of this invention there is provided a method for manufacturing a semiconductor device, which comprises the steps of preparing a substrate, forming a thin film onto the substrate at least at a portion of its principal surface, and growing a semiconductor layer on the substrate having the thin film, a heterojunction being defined between the substrate and the semiconductor layer only in the region where the thin film has been formed, the thin film being made of a single material from the same group of the periodic table as one of the materials constituting the semiconductor layer, or a mixture including the single material.

It is important in this method that the thin film which is formed prior to the growth of a semiconductor layer is not present after the growth between the semiconductor layer and the substrate.

In this invention use may be made of a semiconductor such as silicon, germanium, gallium arsenide and gallium phosphide, as well as an insulator such as sapphire and spinel.

The above-mentioned thin film on the substrate, when formed of a compound such as a semiconductor to be grown afterwards, generally attains a stable state. As a result, a junction is formed between the semiconductor layer and the thin film permanently, and the semiconductor layer formed does not assume a single crystal of good crystallinity. According in this invention, the thin film is formed of a mixture or a single material. As a method for formation of such a thin film on the substrate it is preferable to use a physical method such as a vacuum evaporation, electron beam evaporation, sputtering or molecular beam evaporation. The thickness of the thin film is preferably about 100 to 500 Å, though dependent upon for example the growth requirements of the semiconductor layer and a furnance temperature rise time before growth. A semiconductor layer grown may be an element semiconductor or a compound semiconductor. For the compound semiconductor, the thin film may be formed preferably of a higher-vapor-pressure material which constitutes one of the constituent elements of the compound semiconductor.

BRIEF DESCRIPTION OF THE DRAWINGS

This invention will be more fully described by way of example by referring to the accompanying drawings in which.

PREFERRED EMBODIMENTS OF THE INVENTION

A method for manufacturing a semiconductor device will now be explained below by referring to the accompanying drawings.

Figure 1A:
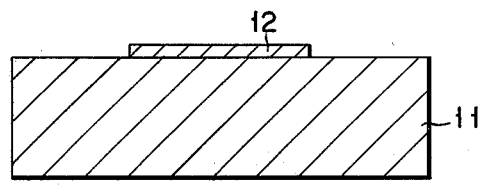
FIGS. 1A to 1C show the processes of a method for manufacturing a semiconductor device according to one embodiment of this invention.

Phosphorus is selectively evaporated in vacuum at least at a portion of the principal surface of an n-type single-crystal substrate 11 with a specific resistivity of about 1 $\Omega$cm by using a metal mask to form a thin film 12 as shown in FIG. 1A. In this embodiment the thin film 12 is formed to have a disk-like configuration having a thickness of about 200 Å and a diameter of about 2 mm. To explain more in detail, one surface of a silicon substrate with a thickness of about 200 $\mu$m and a size of 5×5 mm, after being mirror-polished, was surface-treated with an organic solvent such as acetone and trichloroethylene and, immediately thereafter, evaporation was effected under a vacuum of about $5 \times 10^{-6}$ Torr with the surface-treated substrate kept in a vacuum evaporator.

Figure 1B:
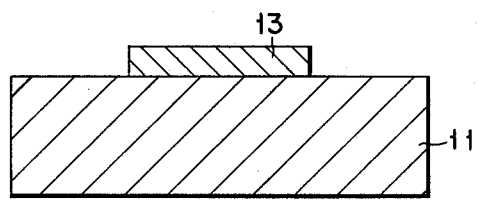

An about 10 $\mu$m-thick gallium phosphide layer 13 with a concentration of $2.7 \times 10^{18}/cm^3$ was formed, as shown in FIG. 1B in a region where the thin film had been formed, using a Zn-entrained Ga-PCl$_3$-H$_2$ vapor growth method. That is, the vapor growth was effected for a reaction time period of 1 hour by introducing PCl$_3$, while using H$_2$ as a carrier gas, into a high-purity quartz tube (reaction vessel) with gallium set at 900° C. and the silicon substrate set at 800°–850° C.

Figure 1C:
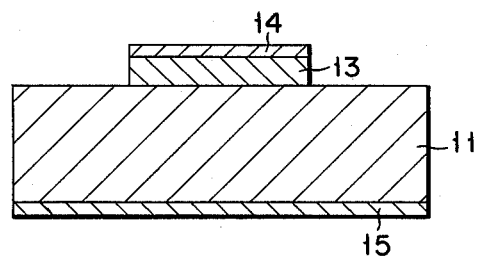

According to this growth method, no gallium phosphide was formed on that principal surface portion of the single crystal substrate where no thin film was formed, and thus that principal surface portion of the single crystal substrate was maintained flat. That is, the gallium phosphide layer 13 was formed only in the region where the film had been formed prior to the growth and nowhere else, and thus no mask was necessary. Finally, an electrode 14 was formed by an indium-zinc alloy on the gallium phosphide layer 13 as shown in FIG. 1C and an electrode 15 was formed by an indium-tin alloy on the other surface of the single crystal substrate 11 as shown in FIG. 1C. In this way, a GaP-Si heterojunction diode was formed.

In the GaP-Si heterojunction diode obtained, no thin film formed of phosphorus was observed between the substrate and the GaP layer and only a heterojunction was noted between the silicon substrate and the gallium phosphide layer.

In addition, the diffusion of the phosphorus into the silicon substrate could not be observed after the growth of the GaP layer according to the measurement of the capacitance vs. voltage and the current vs. voltage characteristics between the back surface of the silicon substrate and its top surface from where the GaP layer was removed chemically for the measurement. Furthermore, the GaP layer could not be grown even if phosphorus had been diffused in a silicon substrate prior to the growth of GaP without forming the thin film of phosphorus. It is clear from these results that the formation of the thin film is essential in this method and the diffusion of material constituting a semiconductor layer into the substrate is not required.

The GaP layer obtained was very good in its adhesion to the single-crystal silicon substrate and was found by an electron beam diffraction method to be of a single crystal.

Figure 2:
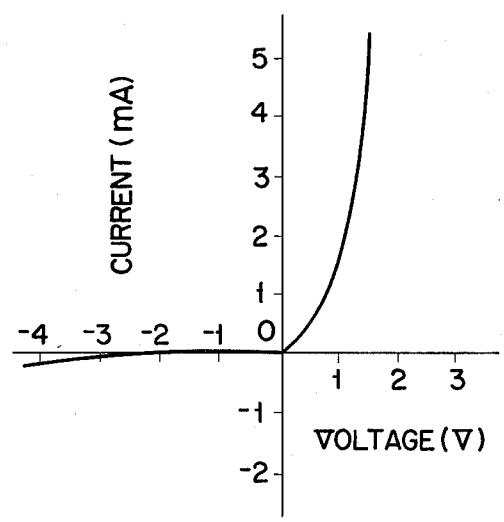
FIG. 2 is a voltage-current characteristic view of a heterojunction diode manufactured by the method of FIG. 1.

The current-voltage characteristic of the GaP-Si heterojunction diode obtained is shown in FIG. 2. From FIG. 2 it will be seen that the obtained GaP-Si heterojunction diode has excellent rectifying characteristics.

Although the method for the manufacture of a heterojunction diode has been explained, it can of course be applied to the manufacture of the other semiconductor devices, one example of which be explained below.

Figure 3A:
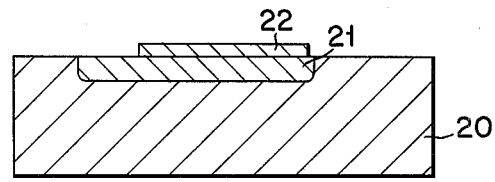
FIGS. 3A and 3B are views for explaining a method for manufacturing a heterojunction emitter transistor.
Figure 3B:
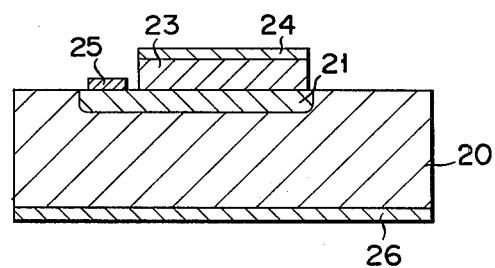

FIGS. 3A and 3B show a manufacture of a heterojunction emitter transistor. In this embodiment, an n-type single-crystal silicon substrate 20 was prepared, and boron was selectively diffused from the principal surface of the substrate to form a p-type base layer 21. Phosphorous was evaporated in vacuum on a portion of the base layer 21 to form a thin film 22 as shown in FIG. 3A. Then, a GaP layer 23 is grown by a Ga-PCl$_3$-H$_2$ vapor growth method on the substrate as in the previous embodiment. During the growth time period, tin is introduced into the GaP layer 23. As a result, an n-type GaP layer 23 is provided and a heterojunction is formed between the base layer 21 and the n-type GaP layer 23. Finally, an emitter electrode 24 is formed on the GaP layer 23, a base electrode 25 is formed on the exposed region of the base layer 21 and a collector electrode 26 is formed on the other surface of a single crystal substrate 20, thus providing a transistor.

Figure 4:
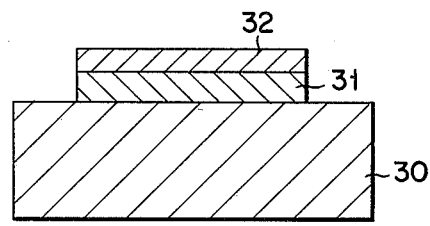
FIG. 4 is a cross-sectional view showing a light emitting diode obtained by the method of FIG. 1.

FIG. 4 shows a light emitting diode formed by using the method of this invention. In this example, phosphorus was evaporated in vacuum onto a thin film, not shown, on one surface of a single-crystal silicon substrate 30 and then an n-type GaP layer 31 and p-type GaP layer 32 were sequentially grown in that order on the substrate. The p-type GaP layer 32 can be formed by diffusing, for example, zinc in the n-type GaP layer 31.

Although, in the aforementioned embodiments, the GaP single-crystal semiconductor layer is grown using the thin P layer, any other combination may be used. The following are examples each showing a combination of a semiconductor layer with a thin layer formed of a material the same with one of the materials constituting the semiconductor layer: a combination of a thin As film with a GaAs semiconductor layer, of a thin S film with a ZnS semiconductor layer, of a thin As film with an InGaAs semiconductor layer, and of a thin As (or P) film with a GaAsP semiconductor layer. Listed below are also examples each showing a combination of a GaP semiconductor layer with a thin film formed of a material which is different from, but the same in its family as, the constituent materials of the semiconductor layer: a combination of a thin Sb film with a GaP semiconductor layer, of a thin P (or Sb) film with a ZnS semiconductor layer and of a thin Se (or Te) film with a GaAs seminconductor layer. Also listed below are examples each showing a combination of a semiconductor layer with a thin layer formed of a mixture including constituent materials from the same group of the periodic table as one of the constituent materials of the semiconductor layer: a combination of a thin film made of mixture of Ga and P with a GaP compound semiconductor layer, of thin film made of mixture of Ga and As with a GaAs compound semiconductor layer, a thin Zn-S mixture film or Se (or Fe)-S mixture film with a ZnS semiconductor layer, and of a thin In. Ga. As mixture film with an InGaAs compound semiconductor layer.

In addition, a semiconductor layer can be grown on the entire surface of a substrate with a large area such as 10×10 mm if a thin film is formed on the entire principal surface although, in the aforementioned embodiments, both the thin film and the semiconductor layer were grown selectively on the substrate.

In order to further improve the crystallinity of a semiconductor layer formed on the substrate according to the method of this invention, the resultant structure may be annealed as will be explained below.

As an atmosphere, use is made of an inert gas such as a high-purity argon or nitrogen gas, or a hydrogen gas, or a mixed gas of inert gas and hydrogen. The annealing temperature and time are properly selected dependent upon the thickness of the thin film. Where the thickness of the thin film is, for example, 500 Å, then 4 hours at 800° C. is proper for annealing.

What we claim is:
1. A method for manufacturing semiconductor device, comprising the steps of:
  forming a thin film layer on at least a portion of the principal surface of a substrate, said thin film layer having a thickness ranging between 100 and 500 Å; and
  growing a semiconductor layer on the portion of said substrate previously covered by said thin film layer permitting said thin film layer to disappear thereby forming a two layer heterojunction between said substrate and said semiconductor layer;
  said semiconductor layer being formed from a compound semiconductor;
  said thin film layer comprising at least one element, said element being selected from the group consisting of elements of the same group of the periodic table as the higher numbered group element of said compound semiconductor, and any additional element present in said thin film layer being selected from the group consisting of elements of the groups of the periodic table other than the group of the lower numbered group element of said compound semiconductor.

2. The method according to claim 1, in which said thin film layer is formed by a physical method.

3. A method for manufacturing a semiconductor device comprising the steps of:
  evaporating phosphorus on at least a portion of the surface of a single-crystal silicon substrate to form a thin phosphorus layer; and
  growing a gallium phosphide layer on the portion of said silicon substrate previously covered by said thin phosphorus layer permitting said thin phosphorus layer to disappear thereby forming a two layer heterojunction between said silicon substrate and said gallium phosphide layer.

* * * * *